(12) United States Patent
Costa et al.

(10) Patent No.: US 7,135,766 B1
(45) Date of Patent: Nov. 14, 2006

(54) INTEGRATED POWER DEVICES AND SIGNAL ISOLATION STRUCTURE

(75) Inventors: Julio Costa, Summerfield, NC (US); Tony Ivanov, Summerfield, NC (US); Michael Carroll, Jamestown, NC (US)

(73) Assignee: RF Micro Devices, Inc., Greensboro, NC (US)

(*) Notice: Subject to any disclaimer, the term of this patent is extended or adjusted under 35 U.S.C. 154(b) by 0 days.

(21) Appl. No.: 10/999,314

(22) Filed: Nov. 30, 2004

(51) Int. Cl.
*H01L 23/12* (2006.01)
*H01L 23/053* (2006.01)

(52) U.S. Cl. .................................................. 257/700
(58) Field of Classification Search ............... None
See application file for complete search history.

(56) References Cited

U.S. PATENT DOCUMENTS

| | | | |
|---|---|---|---|
| 5,436,497 A | 7/1995 | Miyauchi et al. ............ 257/587 |
| 5,444,300 A | 8/1995 | Sato et al. .................... 257/737 |
| 6,365,435 B1 | 4/2002 | Wang et al. ................. 438/108 |
| 6,486,534 B1* | 11/2002 | Sridharan et al. ........... 257/659 |
| 6,510,976 B1 | 1/2003 | Hwee et al. ............. 228/180.22 |
| 6,578,754 B1 | 6/2003 | Tung ...................... 228/180.22 |
| 6,592,019 B1 | 7/2003 | Tung .......................... 228/197 |
| 6,599,775 B1 | 7/2003 | Tie et al. ..................... 438/108 |
| 6,633,073 B1 | 10/2003 | Rezvani et al. ............. 257/504 |
| 6,681,982 B1 | 1/2004 | Tung .......................... 228/197 |
| 6,683,384 B1 | 1/2004 | Kossives et al. ............ 257/777 |
| 6,724,084 B1* | 4/2004 | Hikita et al. ................ 257/737 |
| 6,884,661 B1 | 4/2005 | Morris et al. ............... 438/122 |
| 6,885,061 B1* | 4/2005 | Nakazawa et al. .......... 257/330 |
| 2001/0005022 A1* | 6/2001 | Ogura ........................ 257/103 |
| 2003/0127502 A1 | 7/2003 | Alvarez ...................... 228/246 |

OTHER PUBLICATIONS

Sato et al. "Bump Heat Sink Technology—A Novel Assembly Technology Suitable for Power HBTs" GaAs IC Symposium, 1993.

* cited by examiner

*Primary Examiner*—Nathan J. Flynn
*Assistant Examiner*—Benjamin P. Sandvik
(74) *Attorney, Agent, or Firm*—Withrow & Terranova, PLLC

(57) ABSTRACT

A flip chip power device having an integrated low inductance ground and heat sink path and an isolation structure is provided. A substrate is formed having transistors and an ohmic contact region circumscribing the transistors. Dielectric layers are formed on the substrate, and a common metal layer is formed on the dielectric layers. An isolation metal layer is formed on the dielectric layers above the ohmic contact region. The common metal layer is coupled to a first region of each of the transistors, and the isolation metal layer is coupled to the ohmic contact region. A first bump is formed on the common metal layer, and a second bump is formed on the isolation metal layer. When the power device is attached to a second substrate, the first bump forms a low inductance ground and heat sink path to the second substrate, and an isolation structure is formed.

27 Claims, 11 Drawing Sheets

INTEGRATED POWER DEVICES AND SIGNAL ISOLATION STRUCTURE

FIELD OF THE INVENTION

The present invention relates to an integrated power device and isolation structure formed using flip chip technology and providing both isolation from external noise and a low inductance ground and integrated heat sink path.

BACKGROUND OF THE INVENTION

Typically, power amplifiers and digital components for mobile terminals are fabricated as separate modules. As the desire for integrated devices continues to grow, a need has arisen for a power amplifier device capable of integration with digital circuitry on a single semiconductor die. Integration of a power amplifier requires a low inductance ground to have increased gain at high frequencies, heat conduction from the substrate to the environment, and isolation from nearby digital components. For a conventional silicon substrate, a low resistivity (typically less than 0.1 Ohm-cm) wafer is used along with high temperature thermal drives of high dose implants and is subsequently thinned for better thermal performance. However, for high levels of integration, the thermal drives of the high dose implants begin to distort nearby implant regions. Thus, the thermal drives of high dose implants have not been feasible with high levels of integration or are prohibitively complex. Further, adequate isolation is difficult to achieve. Accordingly, there is a need for a power device having an integrated low inductance ground and heat sink path and an improved isolation structure that is formed using mainstream foundry technologies.

SUMMARY OF THE INVENTION

The present invention provides a flip chip power device having an integrated low inductance ground and heat sink path and an integrated isolation structure. In general, a substrate is formed having two or more transistors and an ohmic contact region circumscribing the two or more transistors. One or more dielectric layers are formed on the substrate, and a common metal layer is formed on the dielectric layers. An isolation metal layer is also formed on the dielectric layers and circumscribes the common metal layer. The common metal layer is electrically coupled to a first region of each of the transistors, and the isolation metal layer is electrically coupled to the ohmic contact region. A first bump is formed on the common metal layer, and a second bump circumscribing the first bump is formed on the isolation metal layer. Thus, when the power device is flipped and attached to the second substrate using the first and second bumps, the first bump forms a low inductance ground and heat sink path from the substrate to the second substrate, and an isolation structure is formed circumscribing the transistors of the power device.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1A:
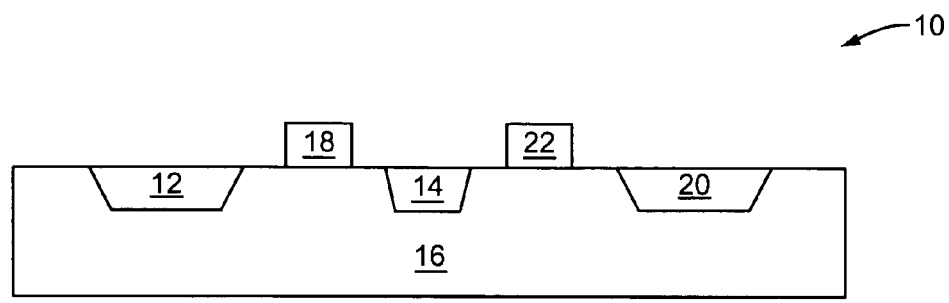
FIGS. 1A–1G illustrate a power device having an integrated low inductance ground and heat sink path at various states in a simplified fabrication process according to one embodiment of the present invention.

FIGS. 1A–1G illustrate a power device 10 at various states in a simplified fabrication process. As illustrated in FIG. 1A, the power device 10 includes first and second transistors. As described herein, the first and second transistors are Field Effect Transistors (FETs). However, it should be noted that the transistors may be alternatively be Bipolar Junction Transistors (BJTs) or any other type of transistor, as will be apparent to one of ordinary skill in the art upon reading this disclosure. It should also be noted that the power device 10 is illustrated as including two transistors for simplicity. However, the power device 10 may include any number of transistors.

The first transistor of the power device 10 is formed by a source region 12 and a drain region 14 formed in a substrate 16, and a gate electrode, typically poly silicon or metal 18 formed on the substrate 16. The second transistor of the power device 10 is formed by a source region 20 formed in the substrate 16, the drain region 14, and a gate electrode 22. In one embodiment, the substrate 16 is a p– doped silicon substrate. The source regions 12 and 20 may each include a p– well and an n+ region forming a source contact region and a p+ region forming a substrate contact region formed within the p– well near the surface of the substrate 16. The drain region 14 may include a Lightly Doped Drain (LDD) implant region and a heavily doped drain contact region formed within the LDD region near the surface of the substrate 16.

Figure 1B:
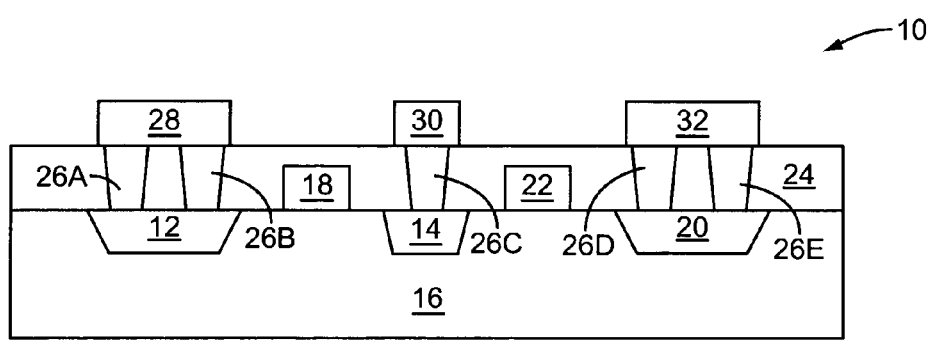

As illustrated in FIG. 1B, a first dielectric layer 24 is deposited on the substrate 16 and the gate electrodes 18 and 22. Vias 26A–26E are formed in the first dielectric layer 24 and filled with a conductive material such as, but not limited to, tungsten or copper. The vias 26A and 26B are formed over the source region 12 of the first transistor, the via 26C is formed over the drain region 14, and the vias 26D and 26E are formed over the source region 20 of the second transistor. As discussed above, in one embodiment, the source regions 12 and 20 may each include an n+ region and a p+ region near the surface of the substrate 16. Accordingly, the via 26A may be formed over the p+ region of the source region 12, and the via 26B may be formed over the n+ region of the source region 12. Thus, in effect, the vias 26A and 26B operate to short the n+ region and the p+ region through the metal layer 28, which is desirable for radio frequency (RF) applications. Similarly, the via 26E may be formed over the p+ region of the source region 20, and the via 26D may be formed over the n+ region of the source region 20. Although two vias are illustrated for coupling the metal layers 28, 32 to the source regions 12, 20, respectively, it should be noted that any number of vias may be used.

Metal layers 28, 30, and 32 are deposited on the first dielectric layer 24. The metal layer 28 is a source metal layer formed over the vias 26A and 26B such that the source metal layer is electrically coupled to the source region 12. The metal layer 30 is a drain metal layer formed over the via 26C such that the drain metal layer is electrically coupled to the drain region 14. The metal layer 32 is a source metal layer formed over the vias 26D and 26E such that the source metal layer is electrically coupled to the source region 20.

Figure 1C:
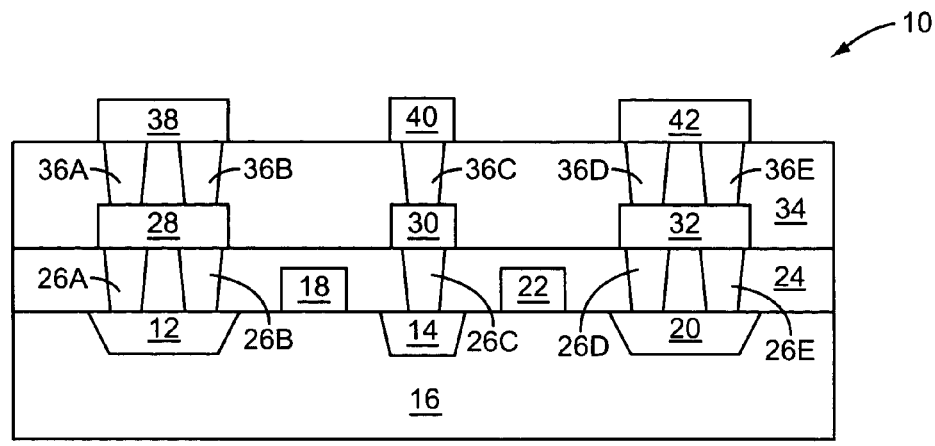

Similarly, as illustrated in FIG. 1C, a second dielectric layer 34 is deposited on the first dielectric layer 24 and the metal layers 28, 30, and 32. A metal layer 38 is deposited on the second dielectric layer 34 and electrically coupled to the metal layer 28 by vias 36A and 36B. A metal layer 40 is deposited on the second dielectric layer 34 and electrically coupled to the metal layer 30 by via 36C. A metal layer 42 is deposited on the second dielectric layer 34 and electrically coupled to the metal layer 32 by vias 36D and 36E. The vias 36A–36E are filled with a conductive material such as, but not limited to, copper.

Figure 1D:
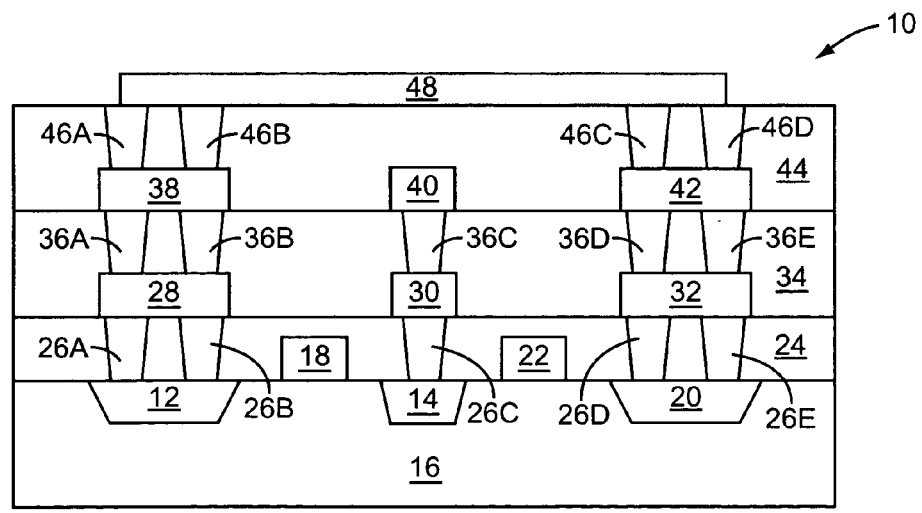

Next, as illustrated in FIG. 1D, a third dielectric layer 44 is deposited on the second dielectric layer 34 and the metal layers 38, 40, and 42. A common source metal layer 48 is deposited on the third dielectric layer 44 and is electrically coupled to the metal layers 38 and 42 by vias 46A–46D, which are filled with a conductive material such as, but not limited to, tungsten or copper. In one embodiment, the power device 10 includes numerous transistors in addition to the first and second transistors described above, and the common source metal layer 48 is deposited on the third dielectric layer 44 over each of the numerous transistors, where the source region of each of the transistors is coupled to the common source metal layer 48 as shown. It should be noted that in another embodiment, the transistors are BJTs, and the emitter of each of the BJTs is coupled to the common metal layer 48.

Figure 1E:
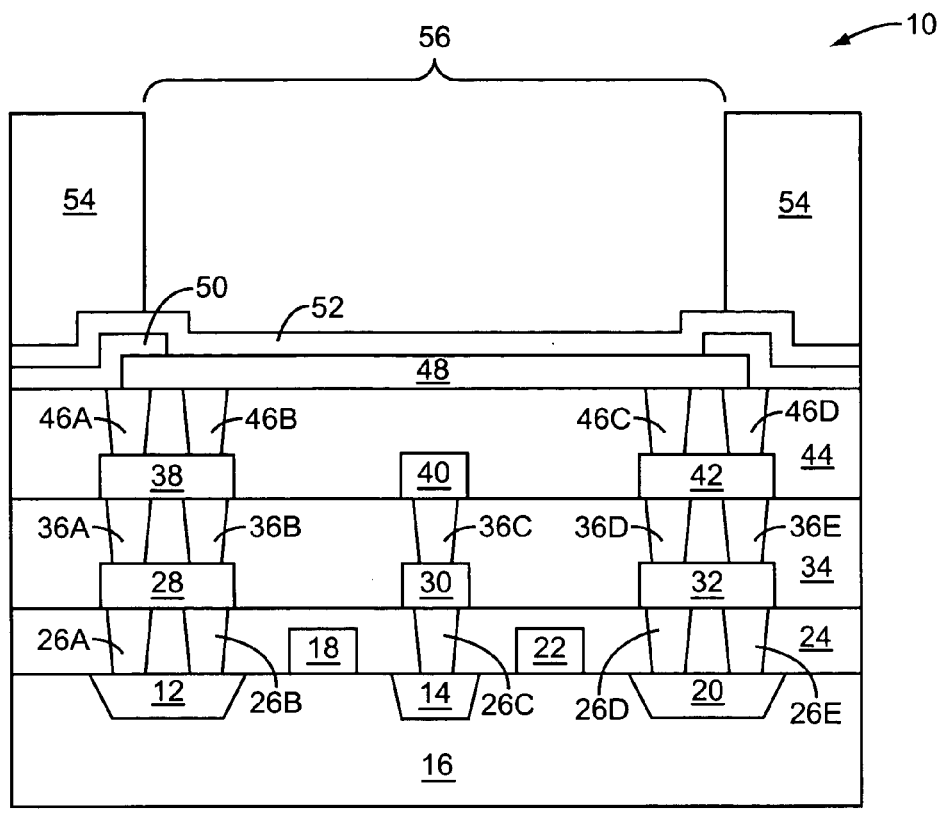
Figure 1F:
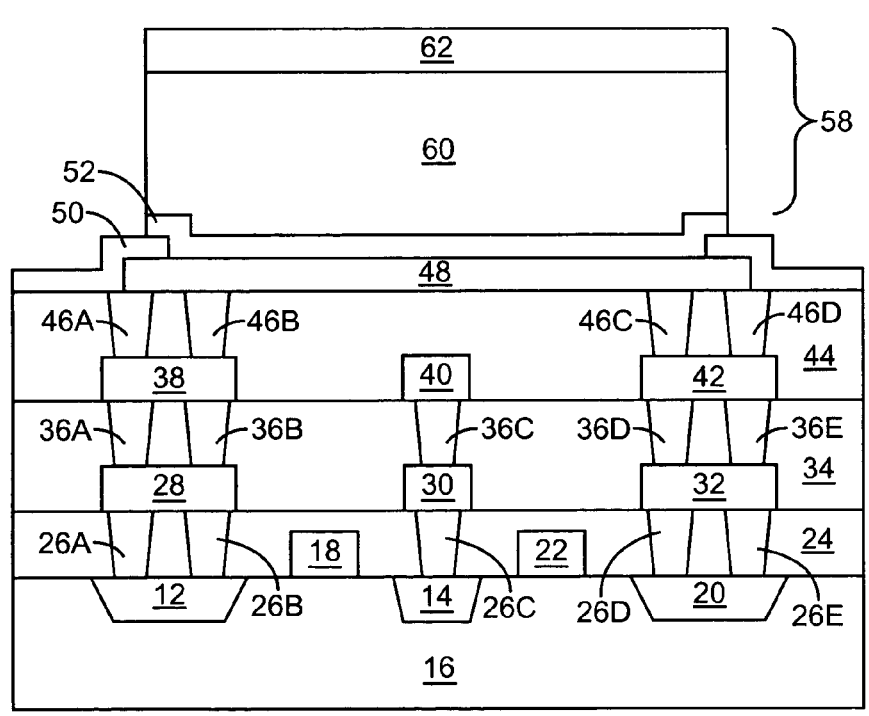

As illustrated in FIG. 1E, a passivation layer 50 and an underbump metallurgy layer 52 are deposited on the third dielectric layer 44 and the common source metal layer 48. A photoresist layer 54 is deposited on the underbump metallurgy layer 52 so as to define a bump area 56. Next, as illustrated in FIG. 1F, a bump 58 is deposited within the bump area 56 (FIG. 1E). The bump 58 includes a metal bump layer 60, which may be copper, and a solder cap layer 62. The size of the bump 58 depends on the amount of heat that needs to be removed, which depends on how much heat is generated by the power device 10, how closely the gate electrodes 18 and 22 are spaced, the required temperature of operation and ambient temperature, etc. Thus, the size of the bump 58 depends on the particular implementation. After the bump 58 is formed, the photoresist layer 54 and a portion of the underbump metallurgy layer 52 (FIG. 1E) are removed.

Figure 1G:
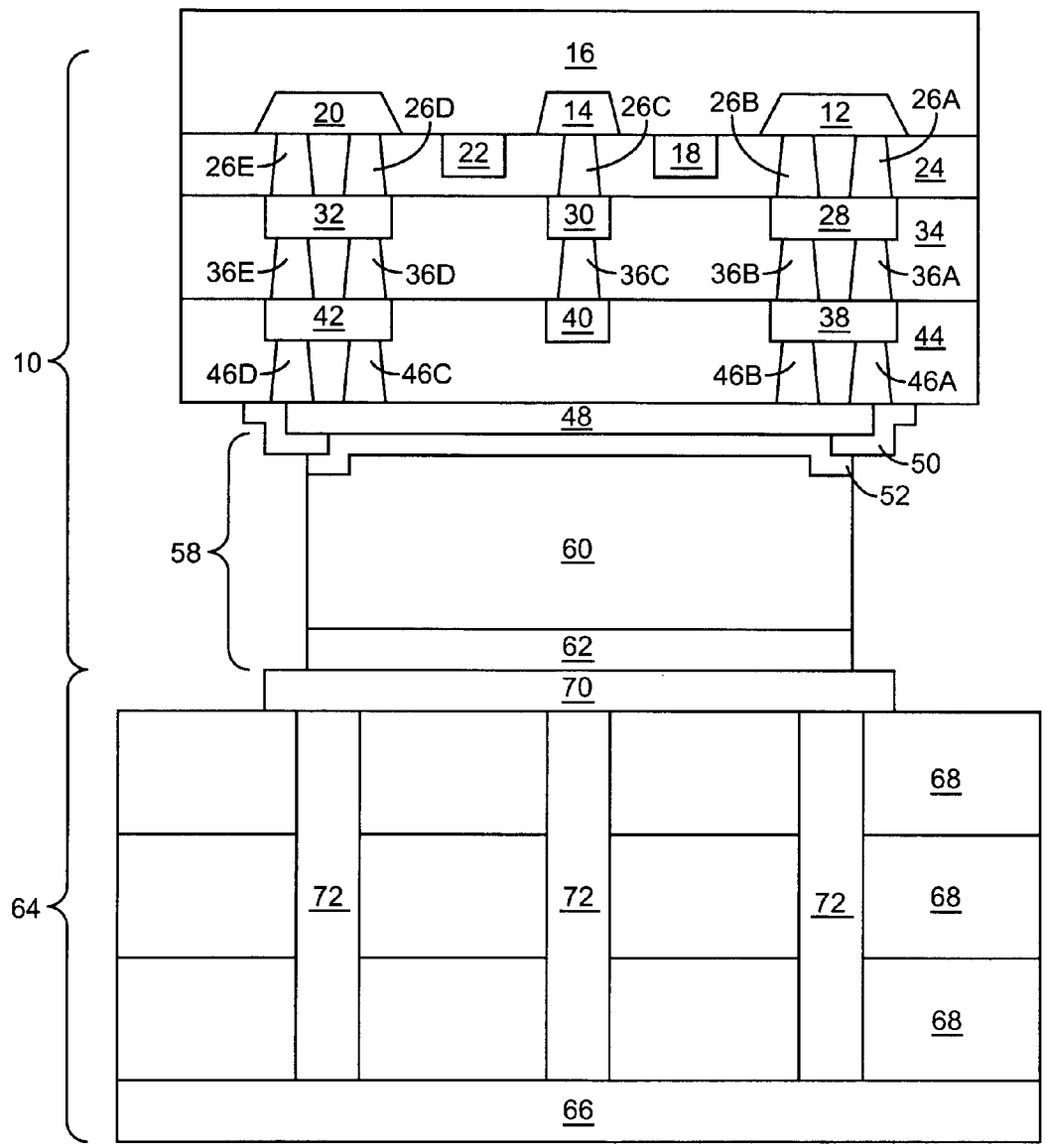

Next, as illustrated in FIG. 1G, the power device 10 is flipped and attached to a substrate 64. The solder cap layer 62 may be heated during the attaching process. The substrate 64 may include a bottom metal layer 66, one or more dielectric layers 68, a metal contact layer 70, and one or more vias 72 filled with conductive material electrically coupling the metal contact layer 70 to the bottom metal layer 66. The bottom metal layer 66 is preferably coupled to ground. Thus, a low inductance ground and integrated heat sink path is formed between the source regions 12 and 20 and the bottom metal layer 66. More specifically, a low inductance ground and integrated heat sink path is formed from the source region 12 through the vias 26A, 26B, the metal layer 28, the vias 36A, 36B, the metal layer 38, the vias 46A, 46B, the common source metal layer 48, the bump 58, the metal contact layer 70, and the vias 72 to the bottom metal layer 66, which is coupled to ground. Similarly, a low inductance ground and integrated heat sink path is formed from the source region 20 through the vias 26D, 26E, the metal layer 32, the vias 36D, 36E, the metal layer 42, the vias 46C, 46D, the common source metal layer 48, the bump 58, the metal contact layer 70, and the vias 72 to the bottom metal layer 66.

Figure 2A:
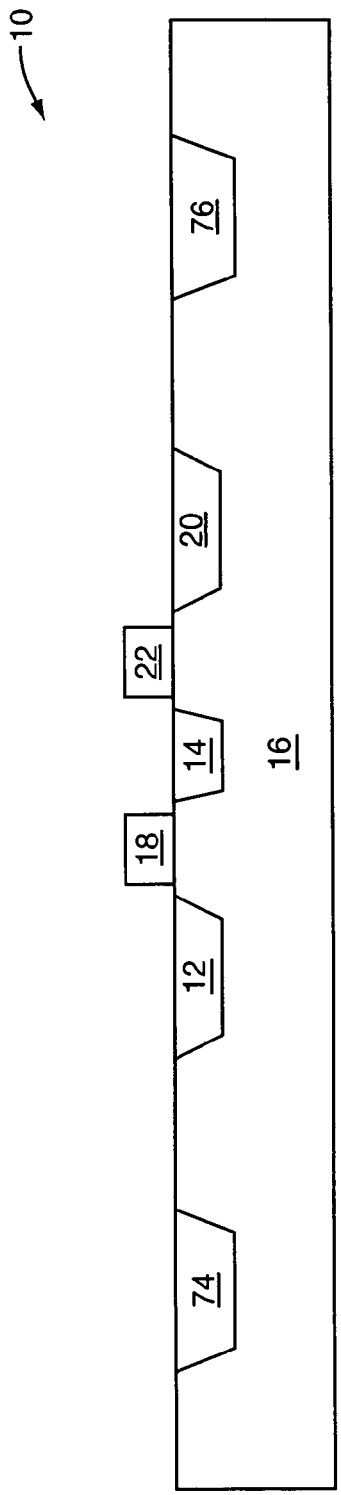
FIGS. 2A–2G illustrate a power device having an integrated low inductance ground and heat sink path and an integrated isolation structure at various states in a simplified fabrication process according to one embodiment of the present invention.

FIGS. 2A–2G illustrate an exemplary embodiment of the power device 10 having an integrated isolation structure in addition to the integrated low inductance ground and heat sink path at various states in a fabrication process. As illustrated in FIG. 2A, the power device 10 includes the first and second transistors, as described above. As described herein, the first and second transistors are Field Effect Transistors (FETs). However, it should be noted that the transistors may be alternatively be Bipolar Junction Transistors (BJTs) or any other type of transistor, as will be apparent to one of ordinary skill in the art upon reading this disclosure. It should also be noted that the power device 10 is illustrated as including two transistors for simplicity. However, the power device 10 may include any number of transistors.

The first transistor of the power device 10 is formed by the source region 12 and the drain region 14 formed in the substrate 16, and the gate electrode 18 formed on the substrate 16. Similarly, the second transistor of the power device 10 is formed by the source region 20 formed in the substrate 16, the drain region 14, and the gate electrode 22. In addition, the substrate 16 includes a first ohmic contact region 74 and a second ohmic contact region 76. In one embodiment, the first and second ohmic contact regions 74 and 76 form a continuous ohmic contact region circumscribing the transistors within the substrate 16.

Figure 2B:
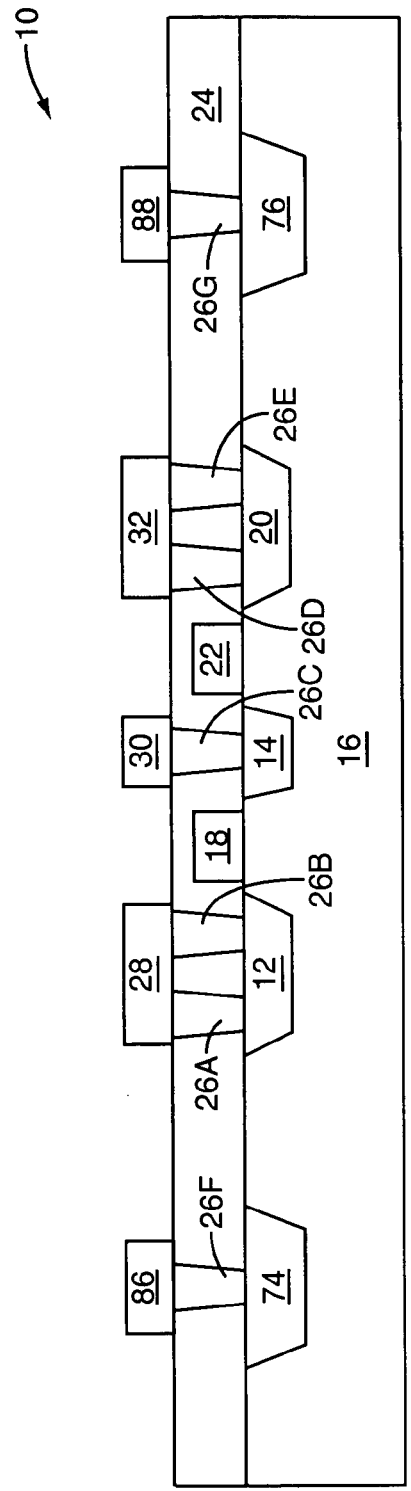

As illustrated in FIG. 2B, the first dielectric layer 24 is deposited on the substrate 16 and the gate electrodes 18 and 22. The vias 26 are formed in the first dielectric layer 24 and filled with a conductive material such as, but not limited to, copper. The vias 26A and 26B are formed over the source region 12 of the first transistor, the via 26C is formed over the drain region 14, the vias 26D and 26E are formed over the source region 20 of the second transistor, the via 26F is formed over the first ohmic contact region 74, and the via 26G is formed over the second ohmic contact region 76.

Metal layers 28, 30, 32, 86, and 88 are deposited on the first dielectric layer 24. The metal layer 28 is a source metal layer formed over the vias 26A and 26B such that the metal layer 28 is electrically coupled to the source region 12. The metal layer 30 is a drain metal layer formed over the via 26C such that the metal layer 30 is electrically coupled to the drain region 14. The metal layer 32 is a source metal layer formed over the vias 26D and 26E such that the metal layer 32 is electrically coupled to the source region 20. The metal layer 86 is formed over the via 26F such that the metal layer 86 is electrically coupled to the first ohmic contact region 74, and the metal layer 88 is formed over the via 26G such that the metal layer 88 is electrically coupled to the second ohmic contact region 76. It should be noted that the vias 26 may be formed before or after the metal layers 28, 30, 32, 86, and 88 are deposited.

Figure 2C:
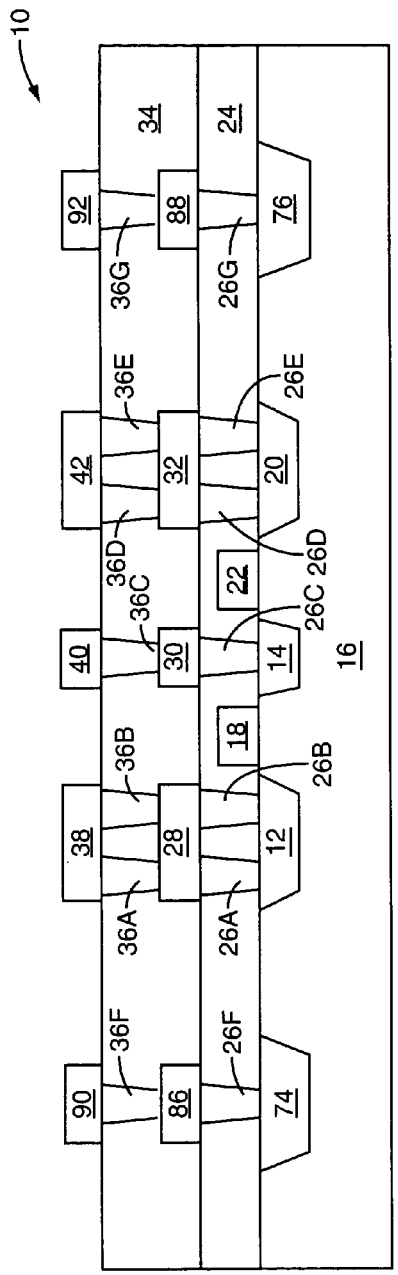

Similarly, as illustrated in FIG. 2C, the second dielectric layer 34 is deposited on the first dielectric layer 24 and the metal layers 28, 30, 32, 86, and 88. The metal layer 38 is deposited on the second dielectric layer 34 and electrically coupled to the metal layer 28 by the vias 36A and 36B. The metal layer 40 is deposited on the second dielectric layer 34 and electrically coupled to the metal layer 30 by the via 36C. The metal layer 42 is deposited on the second dielectric layer 34 and electrically coupled to the metal layer 32 by the vias 36D and 36E. The metal layer 90 is deposited on the second dielectric layer 34 and electrically coupled to the metal layer 86 by the via 36F. The metal layer 92 is deposited on the second dielectric layer 34 and electrically coupled to the metal layer 88 by the via 36G. The vias 36A–36G are filled with a conductive material such as, but not limited to, copper.

Figure 2D:
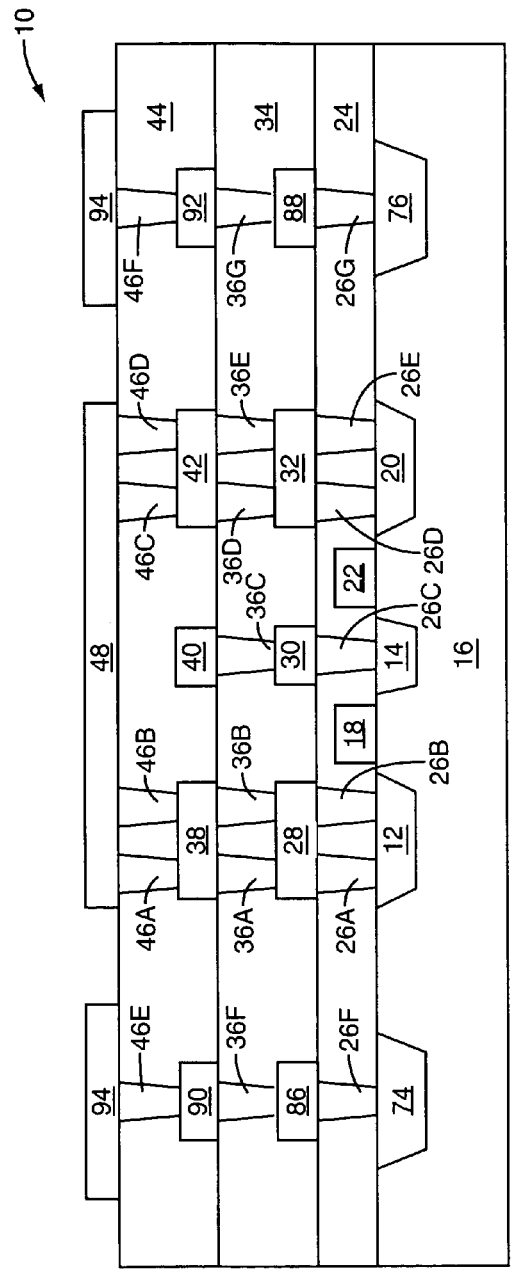

Next, as illustrated in FIG. 2D, the third dielectric layer 44 is deposited on the second dielectric layer 34 and the metal layers 38, 40, 42, 90, and 92. The common source metal layer 48 is deposited on the third dielectric layer 44 and is electrically coupled to the metal layers 38 and 42 by the vias 46A–46D, which are filled with a conductive material such as, but not limited to, copper. In one embodiment, the power device 10 includes numerous transistors in addition to the first and second transistors described above, and the common source metal layer 48 is deposited on the third dielectric layer 44 over each of the numerous transistors, where the source of each of transistors is coupled to the common source metal layer 48 as shown.

In addition, an isolation metal layer 94 is formed on the third dielectric layer 44. The isolation metal layer 94 is electrically coupled to the metal layer 90 by via 46E and the metal layer 92 by via 46F. The vias 46E and 46F are filled with a conductive material. In one embodiment, the isolation metal layer 94 is a continuous metal layer that circumscribes the common source metal layer 48 and thus the output transistor area of the power device 10. This is more clearly illustrated in FIG. 3, discussed below. In addition, the ohmic contact regions 74 and 76 may be a single continuous ohmic contact region that circumscribes the source regions 12 and 20 and the drain region 14 within the substrate 16. The metal layers 86 and 88 may or may not be a continuous metal layer that circumscribes the metal layers 28, 30, and 32 within the second dielectric layer 34. The metal layers 90 and 92 may or may not be a continuous metal layer that circumscribes the metal layers 38, 40, and 42 within the third dielectric layer 44. Similarly, the vias 26F, 26G, the vias 36F, 36G, and the vias 46E, 46F may or may not be continuous vias that circumscribe a volume within each of the dielectric layers 24, 34, and 44 above the transistors within the substrate 16.

Figure 2E:
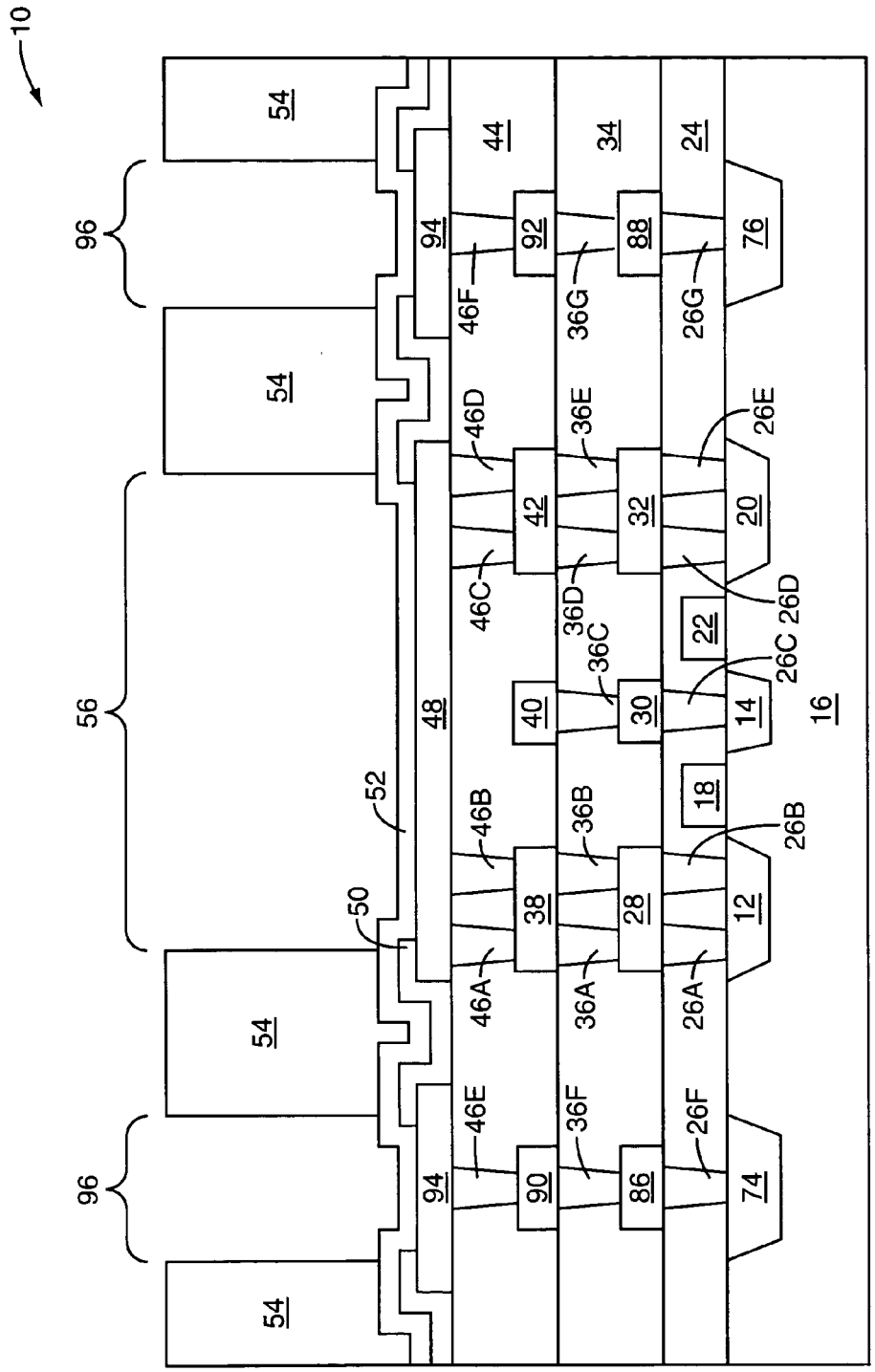

As illustrated in FIG. 2E, the passivation layer 50 and the underbump metallurgy layer 52 are deposited on the third dielectric layer 44, the common source metal layer 48, and the isolation metal layer 94. The photoresist layer 54 is deposited on the underbump metallurgy layer 52 so as to define the bump area 56 and an isolation bump area 96.

Figure 2F:
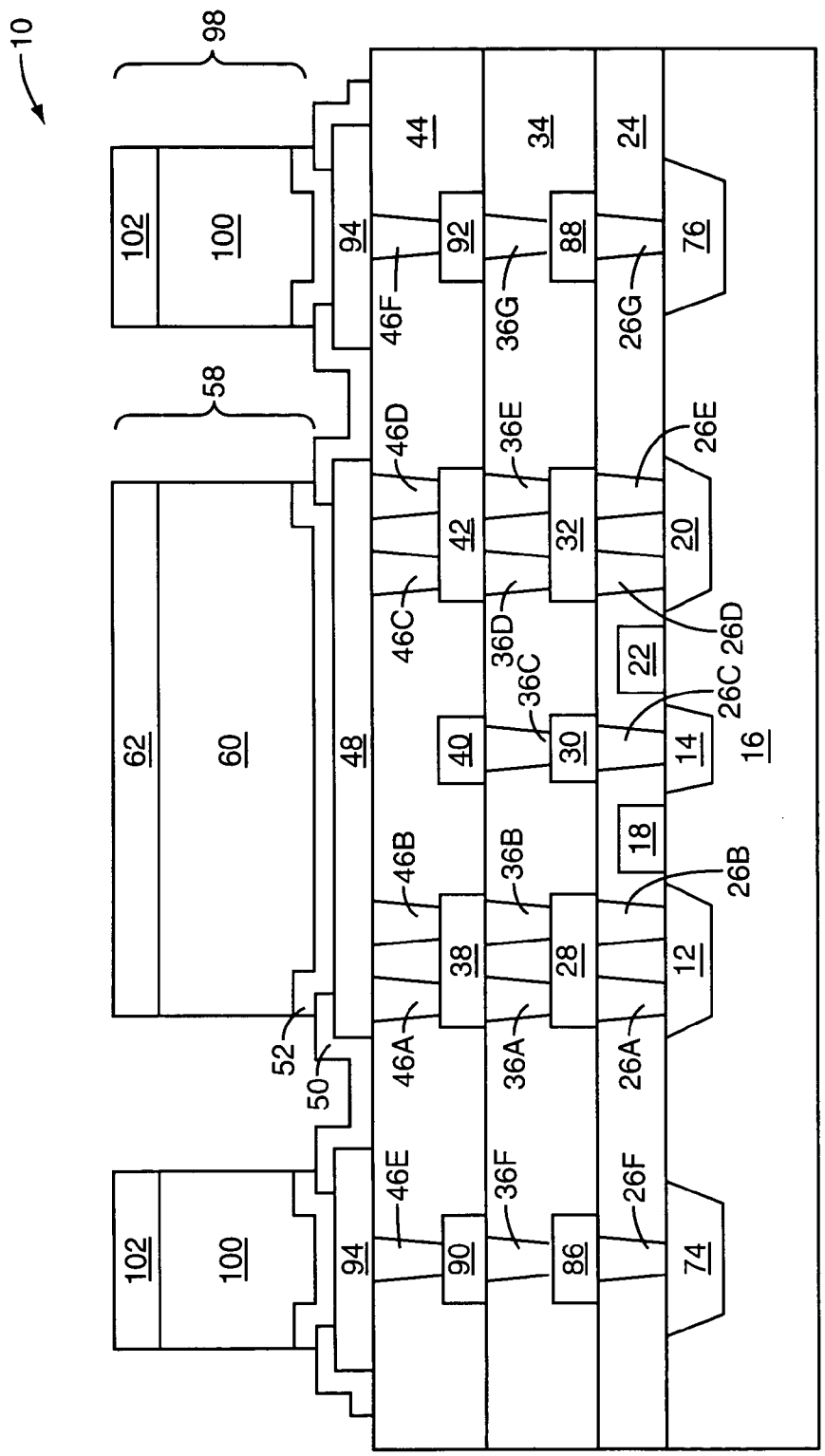

Next, as illustrated in FIG. 2F, the bump 58 is deposited within the bump area 56 (FIG. 2E), and an isolation bump 98 is deposited within the isolation bump area 96 (FIG. 2E). The bump 58 includes the metal bump layer 60 and the solder cap layer 62. Likewise, the isolation bump 98 includes a metal bump layer 100 and a solder cap layer 102. After the bumps 58 and 98 are formed, the photoresist layer 54 and a portion of the underbump metallurgy layer 52 (FIG. 2E) are removed.

Figure 2G:
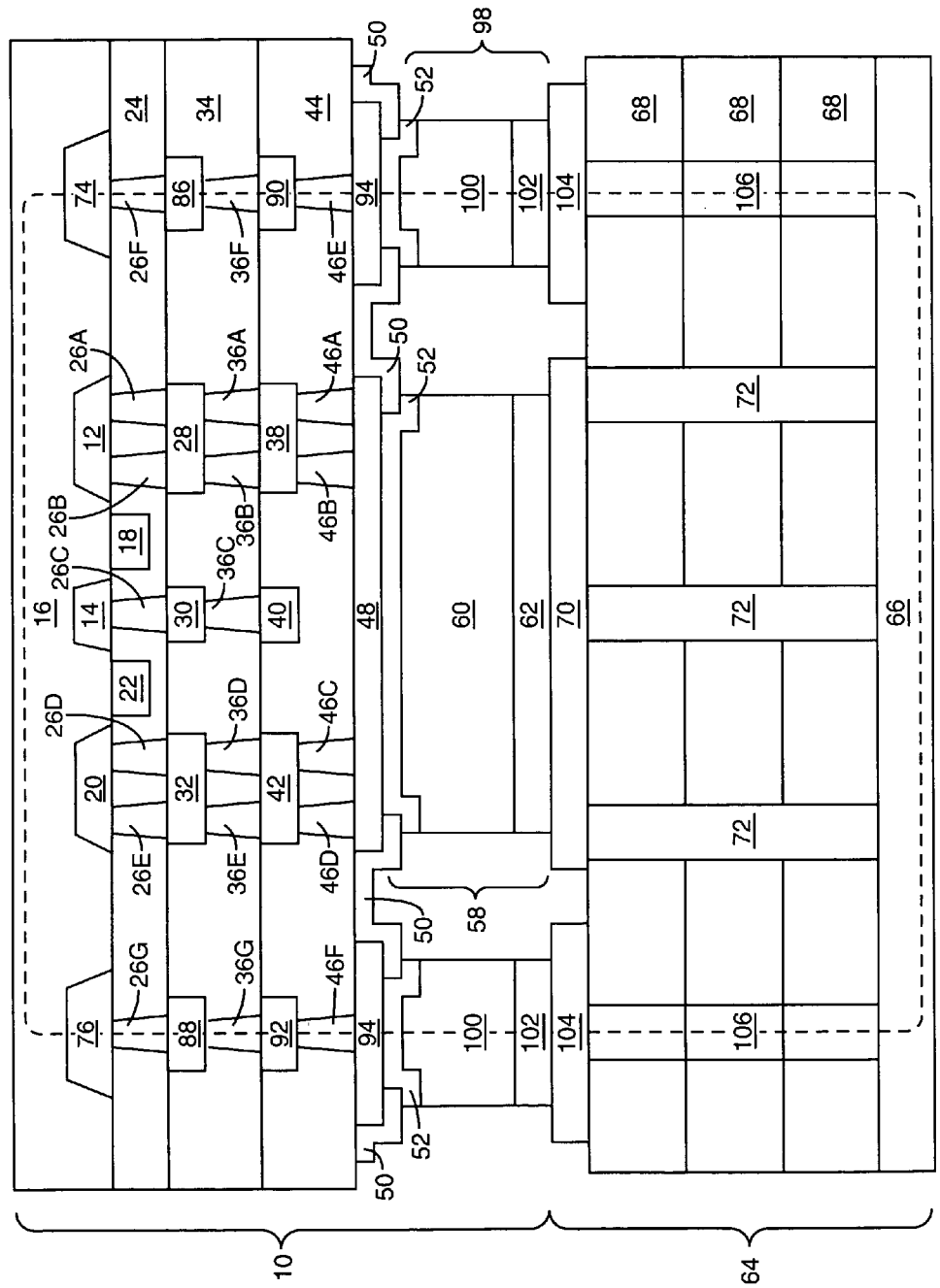

Next, as illustrated in FIG. 2G, the power device 10 is flipped and attached to the substrate 64. As commonly known, the solder cap layers 62 and 102 may be heated during the attaching process. The substrate 64 includes the bottom metal layer 66, the one or more dielectric layers 68, the metal contact layer 70, and the one or more vias 72 filled with conductive material electrically coupling the metal contact layer 70 to the bottom metal layer 66. In addition, the substrate 64 includes an isolation metal contact layer 104. Like the isolation metal layer 94 and the isolation bump 98, the isolation metal contact layer 104 is continuous and circumscribes the metal contact layer 70. The isolation metal contact layer 104 is coupled to the bottom metal layer 66 by vias 106, which are filled with a conductive material. It should be noted that there may be any number of vias 106. Alternatively, in one embodiment, the via 106 is a continuous via formed beneath the isolation metal contact layer 104.

The bottom metal layer 66 is preferably coupled to ground. Thus, a low inductance ground and integrated heat sink path is formed between the source regions 12 and 20 and the bottom metal layer 66. More specifically, a low inductance ground and integrated heat sink path is formed from the source region 12 through the vias 26A, 26B, the metal layer 28, the vias 36A, 36B, the metal layer 38, the vias 46A, 46B, the common source metal layer 48, the bump 58, the metal contact layer 70, the vias 72 to the bottom metal layer 66, which is coupled to ground. Similarly, a low inductance ground and integrated heat sink path is formed from the source region 20 through the vias 26D, 26E, the metal layer 32, the vias 36D, 36E, the metal layer 42, the vias 46C, 46D, the common source metal layer 48, the bump 58, the metal contact layer 70, the vias 72 to the bottom metal layer 66.

In addition, an isolation structure, also known as a Faraday cage, is formed around the transistors of the power device 10 to shield the transistors from external noise. In this embodiment, the isolation structure is formed by the substrate 16, the ohmic contact regions 74, 76, the vias 26F, 36G, 26F, 36G, 46E, 46F, the metal layers 86, 88, 90, 92, the isolation metal layer 94, the isolation bump 98, the isolation metal contact layer 104, the vias 106, and the bottom metal layer 66 (as indicated by the dashed line). The bottom metal layer 66 is preferably coupled to ground. As a result of the isolation structure, the power device 10 may be integrated along with digital circuitry in a single semiconductor die. Thus, for example, digital circuitry may be formed in the substrate 16 or the second substrate 64 outside of the isolation structure, wherein the isolation structure prevents interference between the transistors within the isolation structure and the digital logic outside of the isolation structure.

There are numerous methods of forming interconnections between the transistors of the power device 10 within the isolation structure and nodes outside of the isolation structure. For example, if the vias 26F, 26G are a continuous via, a gap may be formed in the continuous via such that an interconnection may pass through the gap from the gate electrodes 18 and 22 to an external node. Similarly, if the vias 26F, 26G are not a continuous via, an interconnection between the gate electrodes 18 and 22 may be routed through the first dielectric layer 24 in such a manner as to avoid the vias 26F, 26G. In a similar fashion, an interconnection between the metal layer 40 and an external node may be formed. As another example, the gate electrodes 18 and 22 may extend through the first dielectric layer 24 to a point where vias may be used to create a connection between a contact layer on the surface of the third dielectric layer 44 and the gate electrodes 18 and 22, where the contact layer is separate from the common source metal layer 48 but still within the isolation structure. In this case, a gap could be formed within the isolation metal layer 94, and an interconnection between the contact layer for the gate electrodes 18 and 22 and an external node may pass through the gap in the isolation metal layer 94. Similarly, interconnections between the metal layer 40 and an external node may be formed. Numerous other methods of forming interconnections from within the isolation structure to an external node will be apparent to one of ordinary skill in the art upon reading this disclosure.

Figure 3:
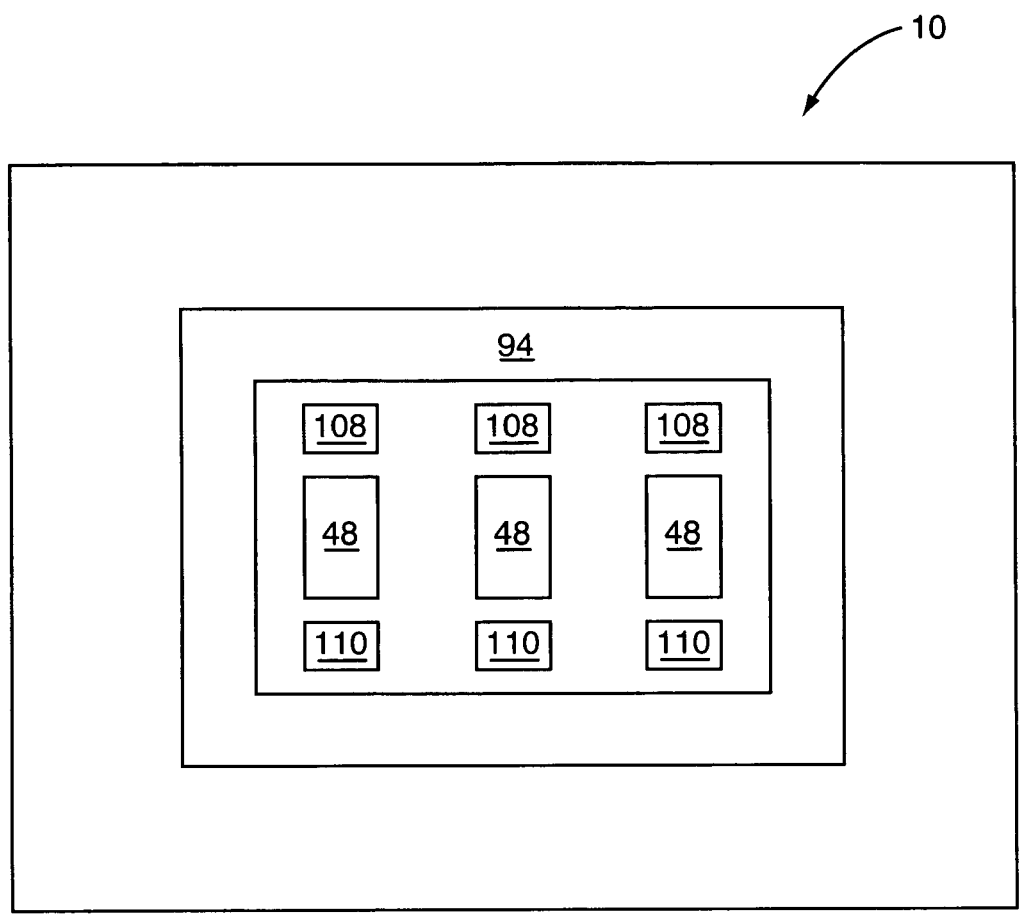
FIG. 3 is a bottom up view of the power device of FIG. 2D.

FIG. 3 illustrates a bottom-up view of an exemplary embodiment of the power device 10 of FIG. 2D. As shown, the isolation metal layer 94 is a continuous metal layer that circumscribes the common source metal layers 48. In this embodiment, the isolation metal layer 94 is substantially square. However, the isolation metal layer 94 may be any shape. Further, the isolation metal layer 94 may contain gaps allowing interconnections between nodes within the isolation metal layer 94, such as gate and drain metal contact layers 108 and 110, and nodes external to the isolation metal layer 94.

It should be noted that in this exemplary embodiment, there are three common source metal layers 48. Each of the common source metal layers 48 may be coupled to the sources of any number of transistors. For example, in one embodiment, each of the common source metal layers 48 is coupled to the sources of two transistors. As another example, each of the common source metal layers 48 may be coupled to the sources of two hundred transistors. It should also be noted that each of the common source metal layers 48 may be coupled to different numbers of transistors.

Figure 4:
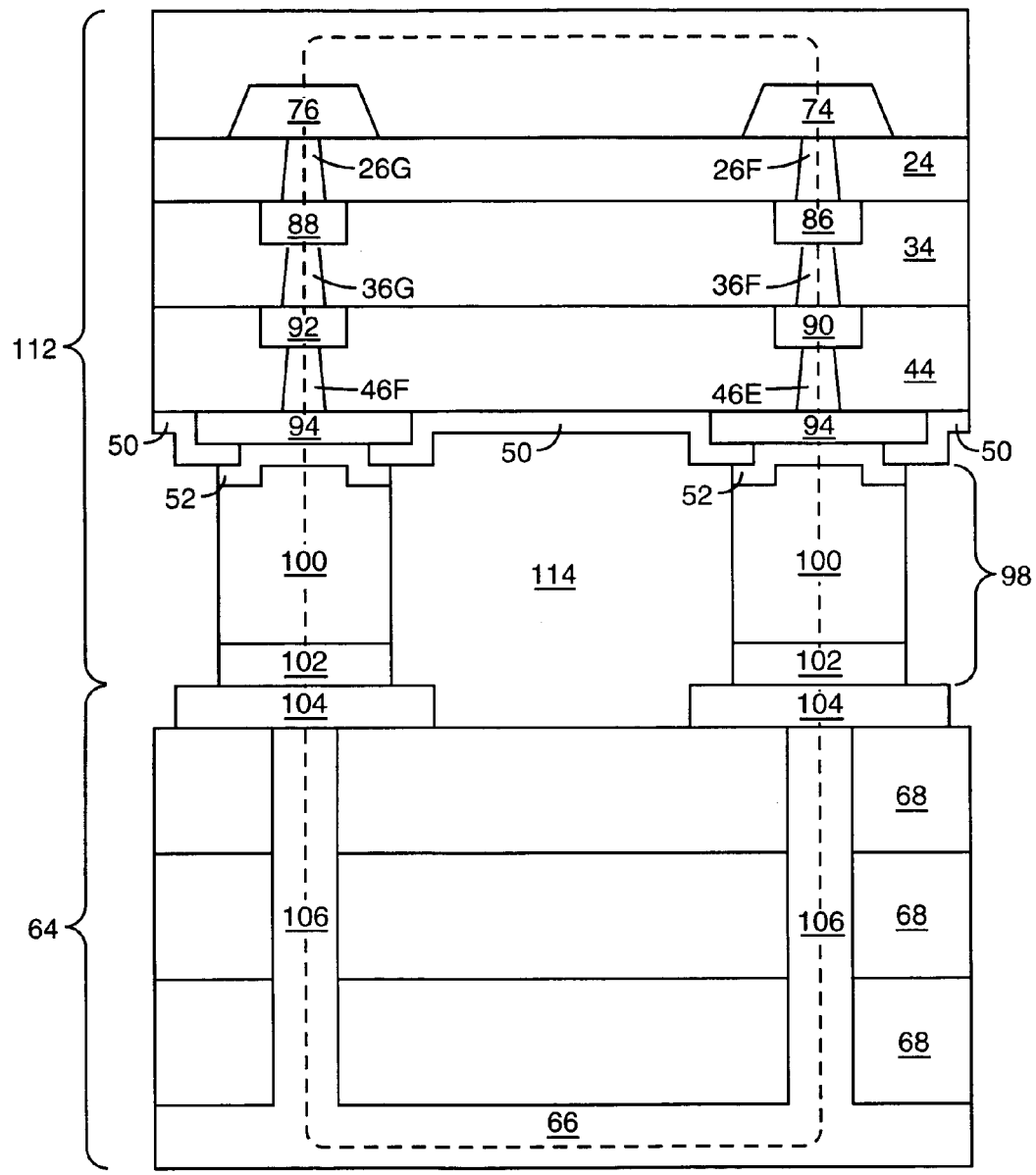
FIG. 4 illustrates an integrated isolation structure according to one embodiment of the present invention.

FIG. 4 illustrates an isolation structure according to another embodiment of the invention, which is similar to the isolation structure of FIGS. 2A–2G. However, in this embodiment, the power device 10 is replaced by a cap structure 112. The cap structure 112 is formed by the substrate 16, the dielectric layers 24, 34 and 44, the isolation metal layer 94, and the isolation bump 98. As discussed above, the first and second ohmic contact regions 74 and 76 are formed in the substrate 16. In this embodiment, the first and second ohmic contact regions 74 and 76 are p+ regions. Similarly to FIG. 20 discussed above, the isolation structure, also known as a Faraday cage, is formed to shield a device within an isolated volume 114 from external noise. In this embodiment, the isolation structure is formed by the substrate 16, the ohmic contact regions 74, 76, the vias 26F, 26G, 36F, 36G, 46E, 46F, the metal layers 86, 88, 90, 92, the isolation metal layer 94, the isolation bump 98, the isolation metal contact layer 104, the vias 106, and the bottom metal layer 66 (as indicated by the dashed line). The bottom metal layer 66 is preferably coupled to ground.

As discussed above, the isolation metal layer 94 may be a continuous metal layer that circumscribes an area on the surface of the third dielectric layer 44. In addition, the ohmic contact regions 74 and 76 may be a single continuous ohmic contact region below the isolation metal layer 94 that circumscribes an area within the substrate 16. The metal layers 86 and 88 may or may not be a continuous metal layer that circumscribes an area within the second dielectric layer 34. The metal layers 90 and 92 may or may not be a continuous metal layer that circumscribes an area within the third dielectric layer 44. Similarly, the vias 26F, 26G, the vias 36F, 36G, and the vias 46E, 46F may or may not be continuous vias that circumscribe an area within each of the dielectric layers 24, 34, and 44.

Using the isolation structure, a device such as a Micro-Electromechanical (MEM) device or Surface Acoustic Wave (SAW) filter may be formed on the substrate 64 and isolated from external noise, thereby allowing integration of the MEM device or SAW filter with digital circuitry on a single semiconductor die. Thus, for example, digital circuitry may be formed in the substrate 16 outside of the isolation structure, wherein the isolation structure prevents interference between the MEM device or SAW filter within the isolation structure and the digital logic outside of the isolation structure.

Those skilled in the art will recognize improvements and modifications to the preferred embodiments of the present invention. All such improvements and modifications are considered within the scope of the concepts disclosed herein and the claims that follow.

What is claimed is:

1. A power device comprising:
   a silicon substrate having at least two transistors and an ohmic contact region circumscribing the at least two transistors;
   at least one dielectric layer formed over the silicon substrate;
   a common metal layer formed over the at least one dielectric layer and electrically coupled to a first region of each of the at least two transistors;
   an isolation metal layer formed over the at least one dielectric layer above the ohmic contact region and circumscribing the common metal layer and electrically coupled to the ohmic contact region;
   a first bump formed over the common metal layer; and
   a second bump formed over the isolation metal layer;
   wherein when the power device is mounted on a second substrate using the first and second bumps, the first bump and the common metal layer provide a low inductance ground and heat sink path from the silicon substrate to the second substrate, and the second bump, the isolation metal layer, and the ohmic contact region form an isolation structure isolating the at least two transistors from external devices.

2. The power device of claim 1 wherein the isolation metal layer is continuous.

3. The power device of claim 2 wherein the second bump formed over the isolation metal layer is continuous.

4. The power device of claim 3 wherein the ohmic contact region is continuous.

5. The power device of claim 1 wherein each of the at least two transistors is a Field Effect Transistor (FET).

6. The power device of claim 5 wherein the first region of each of the FETs that is electrically coupled to the common metal layer is a source region of each of the FETs.

7. The power device of claim 6 wherein each of the FETs comprises the source region formed in the silicon substrate, a gate electrode formed over the silicon substrate beneath the at least one dielectric layer, and a common drain region, wherein the common drain region is the drain region for each of the FETs.

8. The power device of claim 1 wherein the common metal layer is electrically coupled to the first region of each of the at least two transistors using at least one via filled with conductive material.

9. The power device of claim 1 wherein the isolation metal layer is electrically coupled to the ohmic contact region using at least one via filled with conductive material.

10. The power device of claim 1 wherein the second substrate comprises:
a bottom metal layer;
at least one dielectric layer formed over the bottom metal layer;
a common metal contact layer electrically coupled to the bottom metal layer by at least one via filled with conductive material, wherein the common metal contact layer is electrically coupled to the common metal layer using the first bump; and
an isolation metal contact layer electrically coupled to the bottom metal layer by at least one via filled with conductive material, wherein the isolation metal contact layer is electrically coupled to the isolation metal layer using the second bump.

11. The power device of claim 1, wherein the isolation structure isolating the at least two transistors from external devices extends into the second substrate to isolate a volume within the second substrate.

12. A method of fabricating a power device comprising:
providing a silicon substrate having at least two transistors and an ohmic contact region circumscribing the at least two transistors;
forming at least one dielectric layer over the silicon substrate;
forming a common metal layer over the at least one dielectric layer;
electrically coupling the common metal layer to a first region of each of the at least two transistors;
forming an isolation metal layer over the at least one dielectric layer above the ohmic contact region and circumscribing the common metal layer;
electrically coupling the isolation metal layer to the ohmic contact region;
forming a first bump over the common metal layer; and
forming a second bump over the isolation metal layer;
wherein when the power device is mounted over a second substrate using the first and second bumps, the first bump and the common metal layer provide a low inductance ground and heat sink path from the silicon substrate to the second substrate, and the second bump, the isolation metal layer, and the ohmic contact region from an isolation structure insulating the at least two transistors from external devices.

13. The method of claim 12 wherein forming the isolation metal layer comprises forming the isolation metal layer such that the isolation metal layer is continuous.

14. The method of claim 13 wherein forming the second bump over the isolation metal layer comprises forming the second bump such that the second bump is continuous.

15. The method of claim 14 wherein providing the silicon substrate comprises providing the silicon substrate such that the ohmic contact region is continuous.

16. The method of claim 12 wherein each of the at least two transistors is a Field Effect Transistor (FET) and electrically coupling the common metal layer to the first region of each of the at least two FETs comprises electrically coupling the common metal layer to a source region of each of the at least two FETs.

17. The method of claim 16 wherein providing the silicon substrate comprises:
forming the source region for each of the at least two FETs in the silicon substrate;
forming a gate electrode over the silicon substrate for each of the FETs beneath the at least one dielectric layer; and
forming a common gate region, wherein the common gate region is the gate region for each of the FETs.

18. The method of claim 12 wherein electrically coupling the common metal layer to the first region of each of the at least two transistors comprises forming at least one via filled with conductive material between the common metal layer and the first region of each of the at least two transistors.

19. The method of claim 12 wherein electrically coupling the isolation metal layer to the ohmic contact region comprises forming at least one via filled with conductive material between the isolation metal layer and the ohmic contact region.

20. The method of claim 12 further comprising:
providing the second substrate having a bottom metal layer, at least one dielectric layer formed over the bottom metal layer, a common metal contact layer electrically coupled to the bottom metal layer by at least one via filled with conductive material, and an isolation metal contact layer electrically coupled to the bottom metal layer by at least one via filled with conductive material;
coupling the common metal contact layer to the common metal layer using the first bump; and
coupling the isolation metal contact layer to the isolation metal layer using the second bump.

21. The method of claim 12, further comprises extending the isolation structure insulating the at least two transistors from external devices into the second substrate for isolating a volume within the second substrate.

22. An isolation structure comprising:
a silicon substrate having an ohmic contact region circumscribing an area within the silicon substrate;
at least one dielectric layer formed over the silicon substrate;
an isolation metal layer formed over the at least one dielectric layer above the ohmic contact region and circumscribing a common metal layer and electrically coupled to the ohmic contact region; and
a continuous isolation bump formed over the isolation metal layer;
wherein when the isolation structure is mounted on a second substrate using the continuous isolation bump, and the continuous isolation bump, the isolation metal layer, and the ohmic contact region form the isolation structure isolating a volume within the isolation structure from external devices.

23. The isolation structure of claim 22 wherein the isolation metal layer is continuous.

24. The isolation structure of claim 22 wherein the ohmic contact region is continuous.

25. The isolation structure of claim 22 wherein the isolation metal layer is electrically coupled to the ohmic contact region using at least one via filled with conductive material.

26. The isolation structure of claim 22 wherein the second substrate comprises:
a bottom metal layer;
at least one dielectric layer formed over the bottom metal layer; and an isolation metal contact layer electrically coupled to the bottom metal layer by at least one via filled with conductive material, wherein the isolation metal contact layer is electrically coupled to the isolation metal layer using the continuous isolation bump.

27. The isolation structure of claim 22, wherein the isolation structure isolating the volume within the isolation structure from external devices extends into the second substrate to isolate a volume within the second substrate.

* * * * *

UNITED STATES PATENT AND TRADEMARK OFFICE
Certificate

Patent No. 7,135,766 B1                                              Patented: November 14, 2006

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Julio Costa, Summerfield, NC (US); Tony Ivanov, Summerfield, NC (US); Michael Carroll, Jamestown, NC (US) and Thomas Scott Morris, Clemmons, NC (US).

Signed and Sealed this Third Day of March 2009.

SUE A. PURVIS
*Supervisory Patent Examiner*
Art Unit 2826